United States Patent
Wang et al.

(10) Patent No.: US 8,169,834 B2
(45) Date of Patent: May 1, 2012

(54) SENSE AMPLIFIER USED IN ELECTRICALLY ERASABLE PROGRAMMABLE READ-ONLY MEMORY AND THE IMPLEMENTING METHOD THEREOF

(75) Inventors: Nan Wang, Shanghai (CN); Zhaogui Li, Shanghai (CN); Xiang Yao, Shanghai (CN); Zi Wang, Heilongjiang (CN); Liang Xu, Shanghai (CN)

(73) Assignee: Shanghai Hua Hong Nec Electronics Company, Ltd., Shanghai (CN)

( * ) Notice: Subject to any disclaimer, the term of this patent is extended or adjusted under 35 U.S.C. 154(b) by 367 days.

(21) Appl. No.: 12/501,435

(22) Filed: Jul. 12, 2009

(65) Prior Publication Data

US 2010/0014356 A1    Jan. 21, 2010

(30) Foreign Application Priority Data

Jul. 17, 2008   (CN) .......................... 2008 1 0043634

(51) Int. Cl.
   *G11C 16/04*   (2006.01)
(52) U.S. Cl. .................... 365/185.27; 365/211; 365/205; 365/206; 365/207
(58) Field of Classification Search .................. 365/211, 365/225, 207, 189.09, 185.21
   See application file for complete search history.

(56) References Cited

U.S. PATENT DOCUMENTS

| | | | | |
|---|---|---|---|---|
| 6,868,025 B2 * | 3/2005 | Hsu | ............................... | 365/211 |
| 7,272,059 B2 * | 9/2007 | Vimercati et al. | ............ | 365/203 |
| 7,382,672 B2 * | 6/2008 | Barth et al. | ................... | 365/208 |
| 7,471,582 B2 * | 12/2008 | Choy et al. | .................... | 365/211 |
| 7,515,493 B2 * | 4/2009 | Di Vincenzo et al. | ........ | 365/207 |
| 7,649,781 B2 * | 1/2010 | Syzdek et al. | ........... | 365/185.21 |
| 7,817,465 B2 * | 10/2010 | Oh et al. | ...................... | 365/163 |

FOREIGN PATENT DOCUMENTS

CN    1848299    10/2006

* cited by examiner

*Primary Examiner* — Pho M Luu
(74) *Attorney, Agent, or Firm* — Ming Chow; Sinorica, LLC

(57) ABSTRACT

A sense amplifier and method of implementing includes a reference current generation circuit, which is used for providing a reference current with a settable temperature coefficient for a main circuit of the sense amplifier; the main circuit is used for comparing the reference current with a storage cell current, and distinguishing between 0 and 1 Storage Cell. A method of implementing the sense amplifier that is as below: With an additional current reference circuit, generating and inputting the reference current with a positive/negative/zero temperature coefficient into the main circuit, by mixing a proportional absolute temperature current and a constant current according to different ratios; a storage cell selection tube in a mirror branch of a biased current of the main circuit, so as to constitute a source degeneration circuit, making the biased current change with the power supply voltage and realizing a gain compensation function.

11 Claims, 5 Drawing Sheets

US 8,169,834 B2

SENSE AMPLIFIER USED IN ELECTRICALLY ERASABLE PROGRAMMABLE READ-ONLY MEMORY AND THE IMPLEMENTING METHOD THEREOF

TECHNICAL FIELD

The present invention relates to a read amplifying circuit of a non-volatile memory in an integrated circuit, and particularly to a sense amplifier used in a twin-transistor (2T) Electrically Erasable Programmable Read-only Memory (EEPROM); the present invention further relates to a method of implementing the above-mentioned sense amplifier.

BACKGROUND TECHNOLOGY

As shown in FIG. 1, the twin-transistor Electrically Erasable Programmable Read-only Memory is composed of a storage array and a peripheral circuit. The peripheral circuit includes such circuits as a pre decoder, a row decoder, a column decoder, a high voltage selector, a logic controller (Control logic), a word line driver of the grid of the storage cell (SWL driver), a column selector, and a sense amplifier.

The sense amplifier circuit is used for distinguishing between '0' Storage Cell and '1' Storage Cell safely and reliably with a storage cell current and the reference current of the non-volatile memory under various process conditions, ranges of the power supply voltage and temperature conditions. A traditional sense amplifier circuit as shown in FIG. 2 is designed in such a way that a reference storage cell or a resistor is used to generate the reference current, which compensates the process conditions and the temperature characteristics to some extent, however generally does not compensate influence of the power supply voltage. The main circuit includes a load compensation circuit 1, a first-stage amplifying circuit 2, a second-stage amplifying circuit 3, and a sequence generation circuit 4. Such a circuit is more effective under the condition that characteristics of the storage cell do not change much with the process, however gradually shows its limitation with the characteristic size reduced continuously; in addition, such a design cannot usually attain the requirements on an occasion where very high reliability is required.

CONTENTS OF THE INVENTION

The purpose of the present invention is to provide a dynamic sense amplifier, whose gain can be automatically compensated with the process, the power supply voltage and temperature. Therefor, the present invention further provides a method of implementing the above-mentioned sense amplifier.

In order to achieve the above-mentioned technical purpose, the sense amplifier of the present invention used in the Electrically Erasable Programmable Read-only Memory includes a reference current generation circuit, which is used for providing a reference current with a settable temperature coefficient for a main circuit of the sense amplifier; and the sense amplifier further includes a main circuit, which is used for comparing the reference current with a storage cell current, and distinguishing between 0 Storage Cell and 1 Storage Cell.

The method of implementing the above-mentioned sense amplifier of the present invention is as below: Using a current reference circuit to generate, by mixing a proportional absolute temperature current and a constant current according to different ratios, the reference current with a positive/negative/ zero temperature coefficient, which is used as a biased current of the load tube of the main circuit of the sense amplifier; and providing a storage cell selection tube in a mirror branch of the biased current of the load tube of the main circuit of the sense amplifier, so as to constitute a source degeneration circuit, thus making the biased current change with the power supply voltage and the process and realizing a gain compensation function.

The sense amplifier of the present invention can automatically compensate the process, the power supply voltage and temperature, and possesses the dynamic high speed property; it lowers the designed reserve margin effectively, and fully develops extreme characteristics of the device, thus improving the reliability, i.e. increasing erasion times and data holding time.

DESCRIPTION OF THE DRAWINGS

The present invention will further be described below in detail with reference to drawings and embodiments.

EMBODIMENTS OF THE INVENTION

The sense amplifier of the present invention used in the Electrically Erasable Programmable Read-only Memory includes a reference current generation circuit, which is used for providing a reference current with a settable temperature coefficient for a main circuit of the sense amplifier; and the sense amplifier further includes a main circuit, which is used for comparing the reference current with the storage cell current and distinguishing between 0 Storage Cell and 1 Storage Cell.

Figure 4:
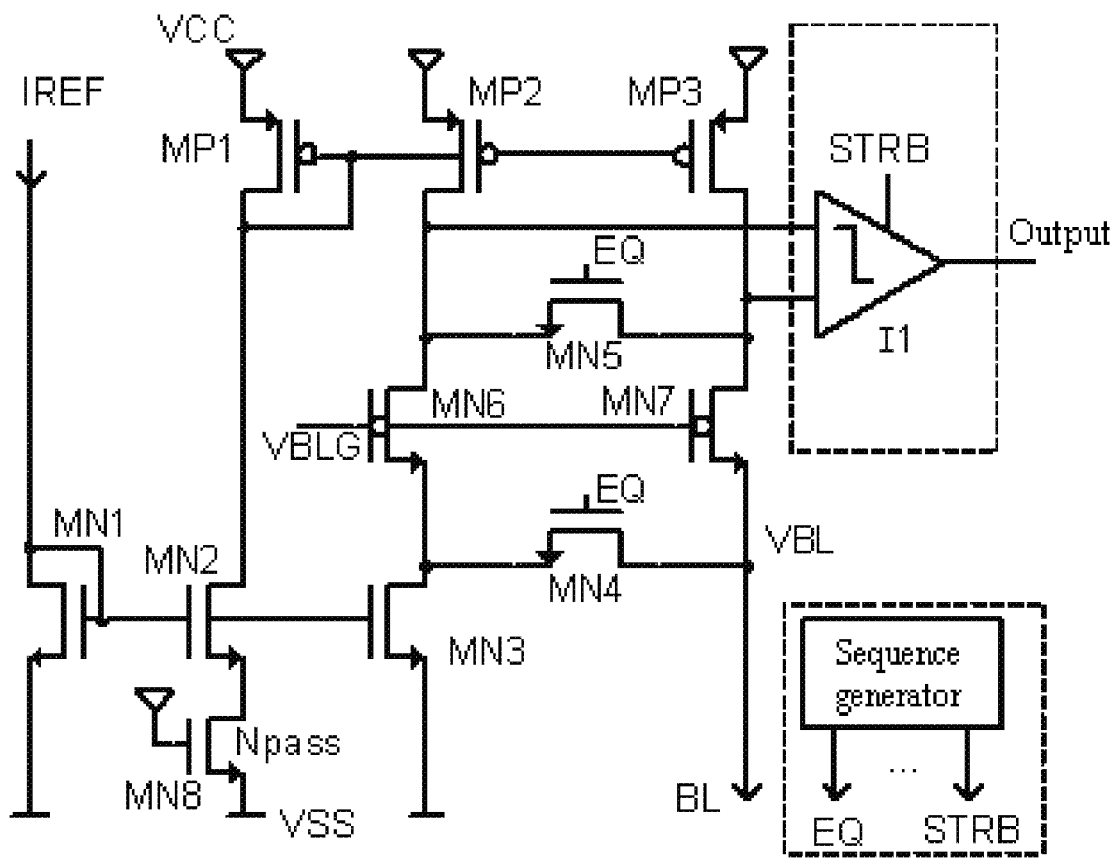
FIG. 4 is a structure diagram of the main circuit of the sense amplifier of the present invention.

The main circuit, as shown in FIG. 4, is composed of four modules:

Load compensation circuit 1: Being composed of a first NMOS transistor MN1, a second NMOS transistor MN2, an eighth storage cell selection tube MN8, and a first PMOS transistor MP1. The grid of the first NMOS transistor MN1 is connected with that of the second NMOS transistor MN2. The eighth storage cell selection tube MN8 is connected at the grid with the power supply, at the drain with the source of the second NMOS transistor MN2, and at the source with the ground, thus constituting a source degeneration circuit. The first PMOS transistor MP1, after its grid and drain being connected with each other, is connected with the drain of the second NMOS transistor MN2, then acting as a load tube of the current source of the second NMOS transistor MN2.

First-stage amplifier circuit 2: Being composed of a second PMOS transistor MP2, a third PMOS transistor MP3, a sixth N-type intrinsic tube MN6, a seventh N-type intrinsic tube MN7, a third NMOS transistor MN3, a fourth NMOS transistor MN4, and a fifth NMOS transistor MN5. The second PMOS transistor MP2 and the third PMOS transistor MP3 constitute a mirror current source together with the first PMOS transistor MP1; the second PMOS transistor MP2, the sixth N-type intrinsic tube MN6, and the third NMOS transistor MN3 are connected serially; and the third NMOS transistor MN3 mirrors the first NMOS transistor MN1 of the load compensation circuit. The third PMOS transistor MP3 is connected serially with the seventh N-type intrinsic tube MN7, whose source is connected with a bit line (BL). The seventh N-type intrinsic tube MN7 mirrors the sixth N-type intrinsic tube MN6, whose grid is connected with the VBLG terminal of an auxiliary circuit.

Second-stage dynamic comparison amplifying circuit 3: Including a dynamic comparison amplifier I1; its input terminals are connected with the drains of the second PMOS transistor MP2 and the third PMOS transistor MP3 of the first-stage amplifying circuit, respectively, and its trigger signal terminal is connected with the output signal STRB of the sequence generation circuit, with its output terminal being the output terminal of the sense amplifier.

Sequence generation circuit 4: Including a sequence generator, which is used for generating control sequence of the equalizing control signal EQ and the dynamic comparator trigger signal STRB, etc., with its output terminals being connected with the first-stage amplifying circuit and the second-stage dynamic amplifying comparison circuit.

Figure 1:
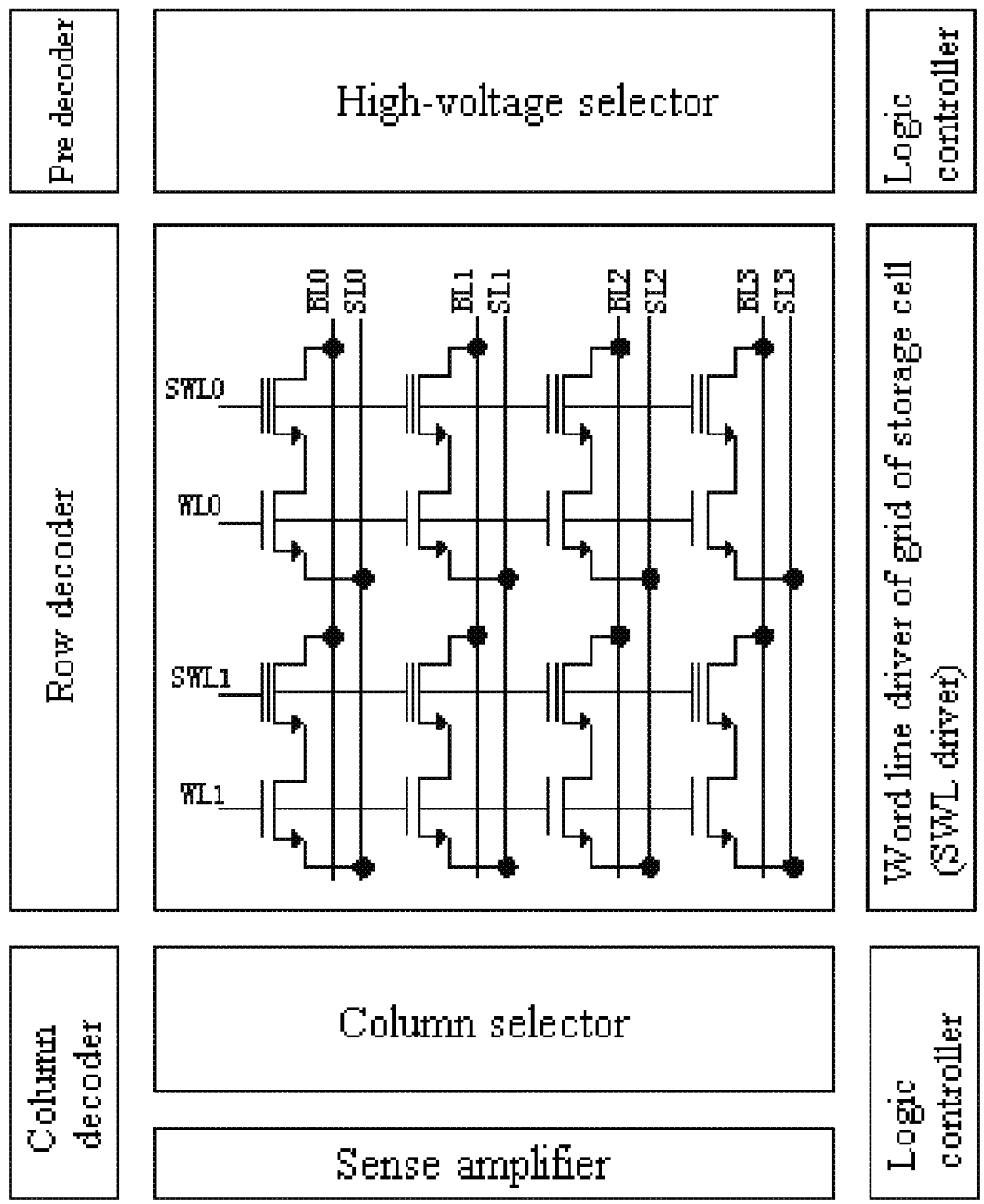
FIG. 1 is a structure diagram of the sense amplifier used in the twin-transistor Electrically Erasable Programmable Read-only Memory.
Figure 2:
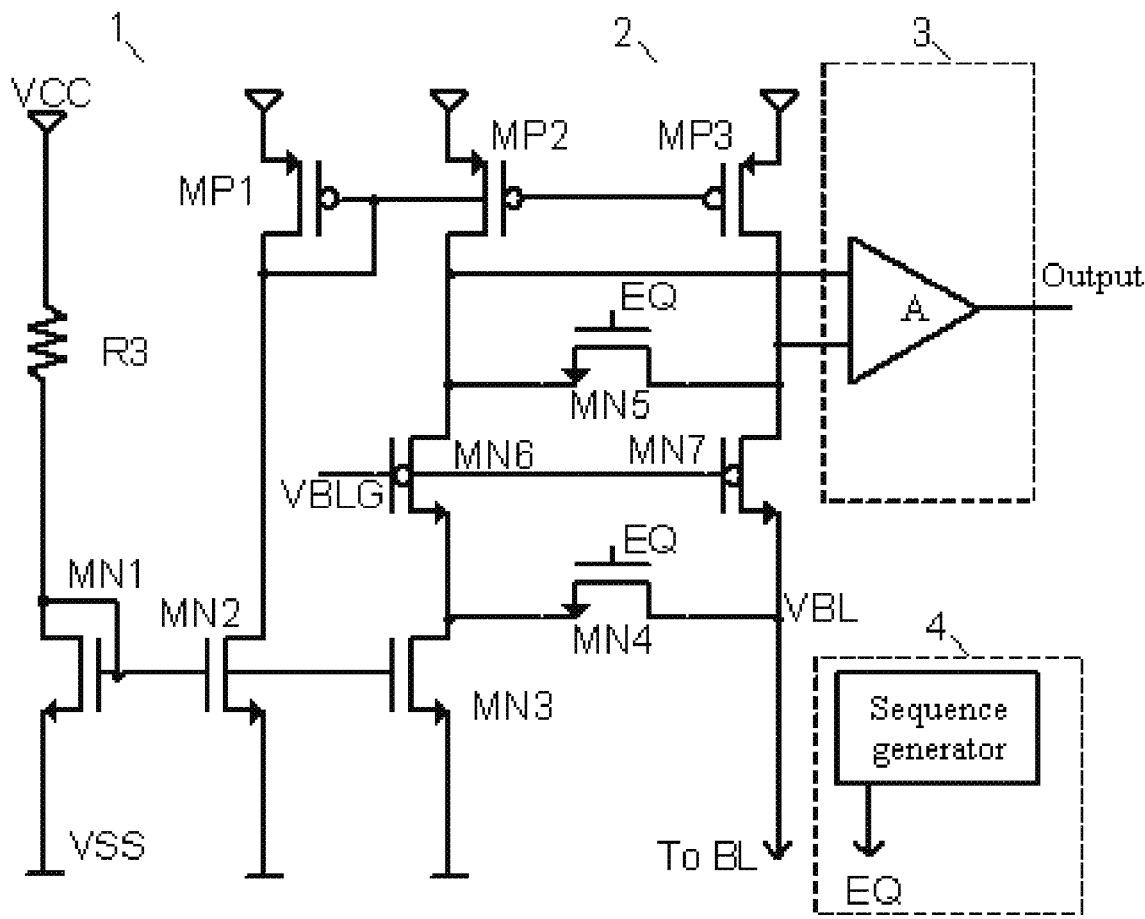
FIG. 2 is the circuit structure diagram of an existing sense amplifier.
Figure 3:
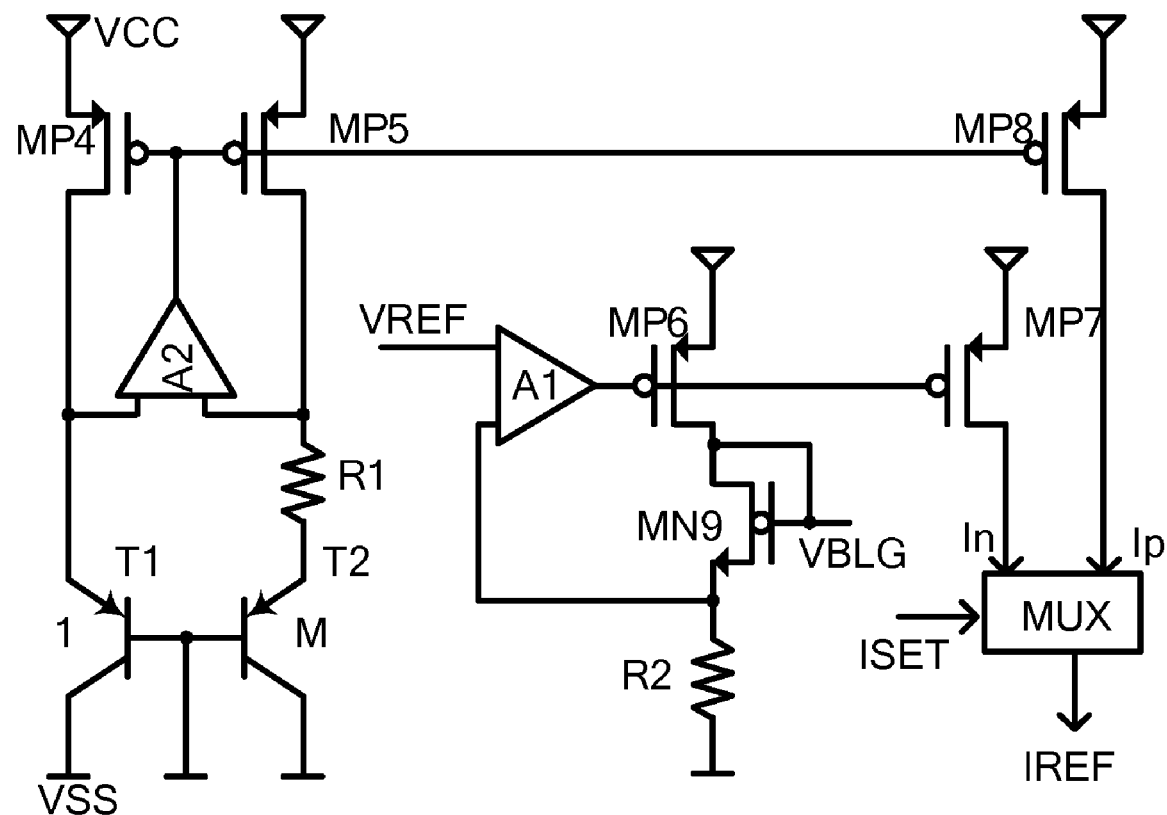
FIG. 3 is a structure diagram of the reference current generation circuit of the sense amplifier of the present invention.

The reference current generation circuit of the sense amplifier, as shown in FIG. 3, is composed of three modules:

Proportional absolute temperature current generator 5 (PTAT current generator): Being composed of a fourth PMOS transistor MP4, a fifth PMOS transistor MP5, an eighth PMOS transistor MP8, an operational amplifier A2, a resistor R1, and PNP tubes T1 and T2. The fourth PMOS transistor MP4 mirrors the fifth PMOS transistor MP5, their drains being connected with the emitter T1 as well as the emitter T2 via the resistor R1, respectively; and T1 and T2 have a common base and a common collector and are all grounded. The eighth PMOS transistor MP8 mirrors the first PMOS transistor MP1 and the second PMOS transistor MP2, generating a current Ip.

The fourth PMOS transistor MP4, the sixth PMOS transistor MP6 and the eighth PMOS transistor MP8 have the same size, and T2 is composed of M pieces of T1, thus obtaining $$I_p = \frac{kT}{qR_1} \times \ln(M)$$

where k is the Boltzman constant, q the unit charge, and T the temperature according to the absolute temperature scale; that is, Ip, being directly proportional to an absolute temperature, is a current with a positive temperature coefficient.

Constant current generator 6: Being composed of a sixth PMOS transistor (MP6), a seventh PMOS transistor MP7, a ninth N-type intrinsic tube MN9, a resistor R2, and a first operational amplifier A1. An inverting input terminal of the first operational amplifier A1 is inputted with a reference voltage VREF, with its output terminal being connected with the grid of the sixth PMOS transistor MP6; the source of the sixth PMOS transistor MP6 is connected with the power supply, and its drain, after being connected serially with the ninth N-type intrinsic tube MN9 with the grid and the drain connected with each other, is fed back to the in-phase input terminal of the first operational amplifier A1. The drain-grid output of the first NMOS transistor MN1 is VBLG. The seventh PMOS transistor MP7 mirrors the sixth PMOS transistor MP6, generating a current In.

$$I_n = \frac{Vref}{R2}$$

The reference voltage VREF can usually be designed to have a zero or a very small temperature coefficient (usually being smaller than 100 ppm; that is, the voltage change is smaller than 0.01% whenever the temperature changes by one degree Celsius); the resistor R2, being usually a polysilicon resistor, has a very small temperature coefficient (being smaller than 100 ppm/degree Celsius; that is, the resistance change of the resistor is smaller than 0.01% whenever the temperature changes by one degree Celsius).

Mixer (MUX): Being used for mixing the proportional absolute temperature current In and the constant current Ip, and generating the reference current IREF with a positive/negative/zero temperature coefficient, which is outputted to the main circuit of the sense amplifier.

The main circuit is connected with the auxiliary circuit through an IREF terminal and the VBLG terminal, that is, the reference current flows from the auxiliary circuit to the main circuit, and the bit line limiting voltage is obtained by the auxiliary circuit providing the control voltage VBLG for the main circuit.

The reference current circuit generates a reference current, whose amount and temperature coefficient are adjustable; a corresponding value can be set when a silicon chip is tested according to process conditions of the storage cell, thus compensating the process and the temperature. The current generated by the portion of the proportional absolute temperature current generator of the circuit is directly proportional to the absolute temperature, i.e. possessing a positive temperature coefficient; while the portion of the constant current, due to dividing a precise voltage by a resistance with a very small temperature coefficient, obtains a current with a temperature coefficient near zero. The mixer can, via an exterior setting, make a certain ratio of the current of the proportional absolute temperature current generator and a certain ratio of the constant current be added together or reduced from each other, thus obtaining a reference current with a positive/negative/zero temperature coefficient. By mirroring a current in a weighted way, the output current can be regulated according to the exterior setting. The reference current is sent into the IREF terminal of the main circuit of the sense amplifier through the IREF terminal.

Figure 5:
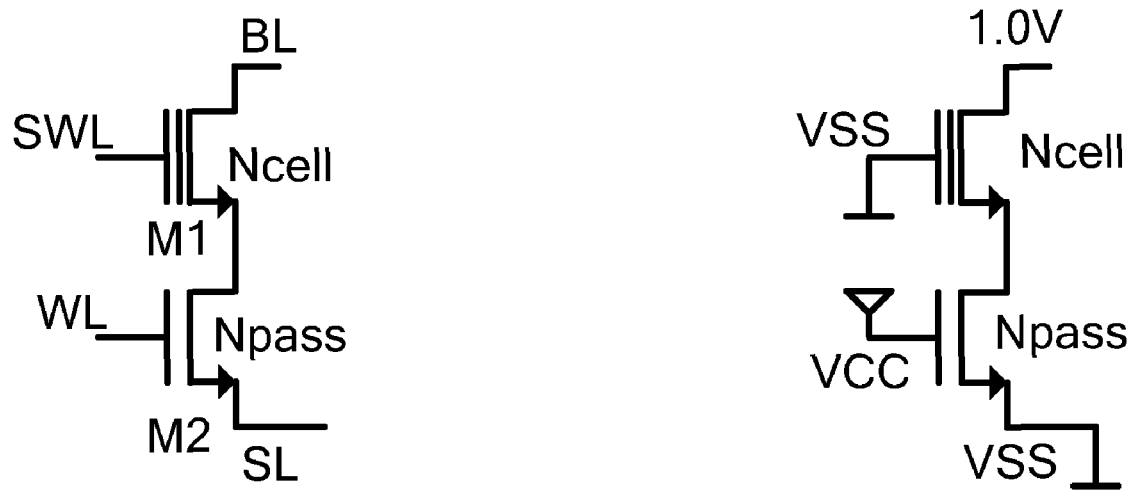
FIG. 5 is a structure diagram of the sense amplifier used in the storage cell of the twin-transistor Erasable Programmable Read-only Memory as well as setting of each terminal when the memory cell reads.

The amplifier uses a PMOS-pair load, and the bias current of the PMOS pair is provided by the reference circuit. As shown in FIG. 5(a), the storage cell of the twin-transistor memory is composed of a storage tube Ncell and a selection tube Npass connected serially; and the storage cell has four terminals, a storage grid word line SWL, a word line WL, a bit line BL, and a source line SL. FIG. 5(b) shows that when the storage cell is in read mode, the above-mentioned four terminals are connected with the ground, the power supply, the bit voltage (1V) and the ground, respectively. The impedance of the selection tube, which is connected serially between the storage tube and the ground, will affect output current of the storage cell. In the load compensation module, the storage cell selection tube is provided in a circuit mirrored by the reference current toward the PMOS load, constituting the source degeneration. When the storage cell changes with the process, such as in the slow corner, the threshold voltage will go up, and the equivalent impedance increase, making the storage cell current be reduced; here the source degeneration circuit of the biased circuit will reduce the current correspondingly, and increases the impedance of the PMOS pair, thus increasing the gain and compensating influence of reduction of the storage cell current. With the power supply voltage reduced, the selection tube makes the storage cell current be reduced due to reduced grid voltage and increased impedance; here the current of the source degeneration circuit of the biased circuit is reduced correspondingly, which increases impedance of the PMOS pair and thus increases the gain, and compensates influence of reduction of the storage cell current. Therefore, the process deviation and the power supply voltage can be regulated and compensated automatically, respectively.

The first stage of the amplifier is a current comparison amplifying circuit, that is, comparing the reference current passing the sixth N-type intrinsic tube MN6 with the storage cell current of the seventh N-type intrinsic tube MN7, and generating a voltage difference at the drains of the second PMOS load tube MP2 and the third PMOS transistor MP3. This circuit can also be regarded as a common-grid amplifier composed of the sixth N-type intrinsic tube MN6 and the seventh N-type intrinsic tube MN7. The fourth NMOS transistor MN4 and the fifth NMOS transistor MN5 are used for comparing voltage equalization between a front bit line and the reference, thus improving the comparison speed and reliability.

The second stage of the amplifier, being of a dynamic structure, amplifies the voltage difference of the first stage via the trigger signal STRB and latches the result, thus realizing high speed dynamic sense amplifying and reducing the read time effectively.

The sequence generation circuit of the amplifier is used for generating all of the control sequences related to the amplifier, such as the equalizing control signal and the dynamic comparator trigger signal.

The bit line control voltage is generated as below: A replication structure (Replica) is constituted by bit-line voltage control tubes (the sixth N-type intrinsic tube MN6 and the seventh N-type intrinsic tube MN7) in the main circuit and the control voltage generation tube (the ninth N-type intrinsic tube MN9) in the constant-temperature-coefficient current generation circuit in the auxiliary circuit, with their grids being connected with each other; the output of the seventh N-type intrinsic tube MN7 is the bit line BL; the grid and the drain of the control voltage generation tube (the ninth N-type intrinsic tube MN9) are connected with each other, its source being set at the reference voltage VREF (IV) through the feedback function of the first operational amplifier A1; and thus the bit line voltage BL is controlled around the reference voltage 1 V.

The method of implementing the sense amplifier of the present invention is as below:

Using the current reference circuit to generate, by mixing the proportional absolute temperature current and the constant current according to different ratios, the reference current with a positive/negative/zero temperature coefficient, which is used as the biased current of the load tube of the main circuit of the sense amplifier. The constant current of the current reference circuit is obtained via the operational amplifier follower, which obtains the reference voltage, which is divided by a resistance with a very small temperature coefficient.

Providing the storage cell selection tube in the mirror branch of the biased current of the load tube of the main circuit of the sense amplifier, so as to constitute the source degeneration circuit, thus making the biased current change with the power supply voltage and the process and realizing a gain compensation function. The PMOS transistor load with the current biased is adopted in the main circuit of the sense amplifier. The second-stage dynamic amplifying comparison circuit of the main circuit of the sense amplifier amplifies the first-stage voltage difference via the trigger signal, and latches the result, generating a dynamic amplifying output signal.

In conclusion, the sense amplifier of the present invention can automatically compensate the process, the power supply voltage and temperature, and possesses the dynamic high speed property, which effectively lowers the designed reserve margin, fully develops extreme characteristics of the device, and thus improves the reliability, i.e. increasing erasion times and data holding time.

What is claimed is:

1. A sense amplifier used in an Electrically Erasable Programmable Read-only Memory, wherein the sense amplifier includes the following parts:
   a reference current generation circuit, used for providing a reference current with a settable temperature coefficient for a main circuit of the sense amplifier;
   a main circuit of the sense amplifier, used for comparing the reference current with a storage cell current, and distinguishing between 0 Storage Cell and 1 Storage Cell; and
   the reference current generation circuit includes a constant current generation circuit, a proportional absolute temperature current generation circuit, and a mixer circuit;
   the constant current generation circuit, used for generating the constant current and sending it to the mixer circuit, and meanwhile generating a control voltage to be connected into the main circuit of the sense amplifier;
   the proportional absolute temperature current generation circuit, used for generating the proportional absolute temperature current and sending it into the mixer circuit; and
   the mixer circuit, used for mixing the proportional absolute temperature current and the constant current, and generating the reference current with a positive/negative/zero temperature coefficient to be outputted to the main circuit of the sense amplifier.

2. The sense amplifier used in the Electrically Erasable Programmable Read-only Memory according to claim 1, wherein:
   the constant current generation circuit includes a sixth PMOS transistor (MP6), a seventh PMOS transistor (MP7), a ninth N-type intrinsic tube (MN9), a resistor R2, and a first operational amplifier (A1); the first operational amplifier (A1) is connected at its inverting input terminal with a reference voltage, and at its output terminal with the grid of the sixth PMOS transistor (MP6); as for the ninth N-type intrinsic tube (MN9), its grid and drain are connected with each other and with the source of the sixth PMOS transistor (MP6), and its source is fed back to an in-phase input terminal of the first operational amplifier (A1) and grounded through the resistor R2; the seventh PMOS transistor (MP7) mirrors a current generated by the sixth PMOS transistor (MP6), and inputs the current into the mixer circuit; and the drain-grid output voltage of the ninth N-type intrinsic tube (MN9) is connected into the main circuit of the sense amplifier;
   the proportional absolute temperature current generation circuit includes a fourth PMOS transistor (MP4), a fifth PMOS transistor (MP5), an eighth PMOS transistor (MP8), a second operational amplifier (A2), a resistor R1, a first PNP tube (T1) and a second PNP tube (T2); the fourth PMOS transistor (MP4), mirroring the fifth PMOS transistor (MP5), is connected at its drain with the emitter of the first PNP tube (T1) as well as that of the second PNP tube (T2) through the resistor R1, respectively; the first PNP tube (T1) and the second PNP tube (T2) have a common base and a common collector and are all grounded; and the eighth PMOS transistor (MP8) mirrors a current generated by the fourth PMOS transistor (MP4) and the fifth PMOS transistor (MP5), and inputs the current into the mixer circuit; and the mixer circuit includes a mixer, whose input is a current generated by the seventh PMOS transistor MP7 of the constant current generation circuit and that generated by the eighth PMOS transistor (MP8) of the proportional absolute temperature current generation circuit, whose output current is an input current of the main circuit of the sense amplifier.

3. The sense amplifier used in the Electrically Erasable Programmable Read-only Memory according to claim 1, wherein the main circuit of the sense amplifier includes a load compensation circuit, which includes a first NMOS transistor (MN1), a second NMOS transistor (MN2), an eighth storage cell selection tube (MN8), and a first PMOS transistor (MP1); the grid of the first NMOS transistor (MN1) is connected with that of the second NMOS transistor (MN2); the eighth storage cell selection tube (MN8) is connected at its grid with the power supply, at its drain with the source of the second NMOS transistor (MN2), and at its source with the ground, then constituting a source degeneration circuit; and the first PMOS transistor (MP1), after its grid being connected with its drain, is connected with the drain of the second NMOS transistor (MN2), then acting as a load tube of a current source of the second NMOS transistor (MN2).

4. The sense amplifier used in the Electrically Erasable Programmable Read-only Memory according to claim 3, wherein the main circuit of the sense amplifier further includes a first-stage amplifying circuit, a second-stage dynamic amplifying comparison circuit, and a sequence generation circuit;

the first-stage amplifying circuit includes a second PMOS transistor (MP2), a third PMOS transistor (MP3), a sixth N-type intrinsic tube (MN6), a seventh N-type intrinsic tube (MN7), a third NMOS transistor (MN3), a fourth NMOS transistor (MN4), and a fifth NMOS transistor (MN5); the second PMOS transistor (MP2) and the third PMOS transistor (MP3) constitute a mirror current source together with the first PMOS transistor (MP1); the second PMOS transistor (MP2), the sixth N-type intrinsic tube (MN6), and the third NMOS transistor (MN3) are connected serially; the third NMOS transistor (MN3) mirrors the first NMOS transistor (MN1) of the load compensation circuit; the third PMOS transistor (MP3) is connected serially with the seventh N-type intrinsic tube (MN7); the source of the seventh N-type intrinsic tube (MN7) is connected with a bit line; the seventh N-type intrinsic tube (MN7) mirrors the sixth N-type intrinsic tube (MN6), whose grid is connected with a voltage output terminal of the reference current generation circuit; the source and the drain of the fourth NMOS transistor (MN4) are connected with the sources of the sixth N-type intrinsic tube (MN6) and the seventh N-type intrinsic tube (MN7), respectively; the source and the drain of the fourth NMOS transistor (MN4) are connected with the sources of the sixth N-type intrinsic tube (MN6) and the seventh N-type intrinsic tube (MN7), respectively; and the grids of the fourth NMOS transistor (MN4) and the fifth NMOS transistor (MN5) are connected with the output terminal of the sequence generation circuit;

the second-stage dynamic amplifying comparison circuit includes a dynamic comparator, which is used for amplifying voltage difference of the first stage via a trigger signal and latching the result; its input terminal is connected with the drains of the second PMOS transistor (MP2) and the third PMOS transistor (MP3) of the first-stage amplifying circuit, respectively, and its trigger signal terminal with the output terminal of the sequence generation circuit, with its output terminal being the output terminal of the sense amplifier; and the sequence generation circuit includes a sequence generator, which is used for generating control sequence of an equalizing control signal and a dynamic comparator trigger signal, with its output terminal being connected with the first-stage amplifying circuit and the second-stage dynamic amplifying comparison circuit.

5. A method of implementing the sense amplifier according to claim 1, wherein the method is as below:

using a current reference circuit to generate, by mixing the proportional absolute temperature current and the constant current according to different ratios, the reference current with a positive/negative/zero temperature coefficient, which is used as a biased current of the load tube of the main circuit of the sense amplifier; and providing a storage cell selection tube in a mirror branch of the biased current of the load tube of the main circuit of the sense amplifier, so as to constitute a source degeneration circuit, thus making the biased current change with the power supply voltage and the process and realizing a gain compensation function.

6. The method of implementing the sense amplifier according to claim 5, wherein PMOS transistor load with the current biased is adopted in the main circuit of the sense amplifier.

7. The method of implementing the sense amplifier according to claim 5, wherein the main circuit of the sense amplifier, adopting a second-stage dynamic amplifying comparison circuit, amplifies the voltage difference of the first stage via the trigger signal and latches the result, generating a dynamic amplifying output signal.

8. The method of implementing the sense amplifier according to claim 5, wherein the method of mixing the proportional absolute temperature current and the constant current according to different ratios is as below: generating a current directly proportional to the absolute temperature and a current with a constant temperature coefficient; by setting a ratio, mixing the current directly proportional to the absolute temperature and the current with the constant temperature coefficient according to the different ratios, and reaching the required temperature coefficient.

9. The method of implementing the sense amplifier according to claim 8, wherein the ratio is determined according to process conditions and temperature characteristics.

10. The method of implementing the sense amplifier according to claim 8, wherein the current with the constant temperature coefficient is achieved by obtaining a reference voltage by inputting the reference voltage into an operational amplifier follower, which is then divided by a resistor with a temperature coefficient smaller than 100 ppm.

11. The method of implementing the sense amplifier according to claim 5, wherein the method further includes constituting a replica structure with a bit-line voltage control tube in the main circuit of the sense amplifier and a control voltage generation tube in the constant current generation circuit in the current reference circuit, with their grids being connected with each other; output of the source of the bit-line voltage control tube is the bit line; and the grid and the drain of the control voltage generation tube are connected with each other, and the source is set as the reference voltage based on feedback function of the operational amplifier follower.

* * * * *